United States Patent [19]

Tully et al.

[11] Patent Number: 5,063,427
[45] Date of Patent: Nov. 5, 1991

[54] PLANAR BIPOLAR TRANSISTORS INCLUDING HETEROJUNCTION TRANSISTORS

[75] Inventors: John W. Tully, Rolling Hills Estates; Benedict B. O'Brien, Manhattan Beach; William Hant, Los Angeles; King L. Hu, Torrance, all of Calif.

[73] Assignee: Northrop Corporation, Hawthorne, Calif.

[21] Appl. No.: 490,012

[22] Filed: Mar. 7, 1990

Related U.S. Application Data

[60] Continuation of Ser. No. 234,995, Aug. 22, 1988, abandoned, which is a division of Ser. No. 107,617, Oct. 13, 1987, Pat. No. 4,839,303.

[51] Int. Cl.$^5$ .............. H01L 29/72; H01L 29/161; H01L 29/205
[52] U.S. Cl. .............................. 357/35; 357/16; 357/34
[58] Field of Search ............... 357/36, 35, 35 HB, 16

[56] References Cited

U.S. PATENT DOCUMENTS

| | | | |
|---|---|---|---|
| 4,683,487 | 7/1987 | Ueyanagi et al. | 357/34 |
| 4,739,379 | 4/1988 | Akagi et al. | 357/34 |
| 4,751,195 | 6/1988 | Kawai | 357/34 |
| 4,772,932 | 9/1988 | Tugashi et al. | 357/34 |

FOREIGN PATENT DOCUMENTS 61-274360 12/1986 Japan .................. 357/34 HB

*Primary Examiner*—Andrew J. James
*Assistant Examiner*—Ngan Van Ngo
*Attorney, Agent, or Firm*—Terry J. Anderson; Robert B. Block

[57] ABSTRACT

A bipolar transistor is constructed to include a substrate, a collector layer epitaxial grown on the substrate and a base layer ion implanted in the collector layer. Next a further epitaxial layer is grown on the collector layer over the ion implanted base layer. A base contact region is ion implanted in this further epitaxial layer between the surface of this further layer and the base layer. The base contact region surrounds and defines an emitter in the further layer. A base ohmic contact is formed on the surface of the further layer in a location overlaying and contacting the base contact region. An emitter ohmic contact is also formed on the surface of the further layer in contact with the emitter. Additionally a collector ohmic contact is also formed on this same surface in a position isolated from the emitter by the base contact region. The collector ohmic makes an electrical contact with the collector by utilizing the further layer as a contact pathway.

28 Claims, 5 Drawing Sheets

☒ ION BOMBARDMENT DAMAGE ISOLATION REGIONS
▨ Be·IMPLANTED AND BASE REGIONS
▦ OHMIC METALLIZATION

PLANAR BIPOLAR TRANSISTORS INCLUDING HETEROJUNCTION TRANSISTORS

CROSS REFERENCE TO RELATED APPLICATIONS

This application is a continuation of Ser. No. 07/234,995 filed Aug. 22, 1988 entitled Planar Bipolar Transistors Including Heterojunction Transistors and Method, which was a divisional application of Ser. No. 07/107,617, filed Oct. 13, 1987 now U.S. Pat No. 4,839,303.

This application is related to applications assigned to the same assignee as this invention and entitled Aluminum Lift Off Masking Process and Product, Ser. No. 07/107,626, filed in the name of John W. Tully on Oct. 13, 1987, now U.S. Pat. No. 4,818,712, and Refractory Metal Ohmic Contacts and Method, Ser. No. 07/107,614, filed in the name of John W. Tully on Oct. 13, 1987, both applications having been filed concurrently herewith, of which, the entire contents are herein incorporated by reference.

BACKGROUND OF INVENTION

This invention is directed to fully planar bipolar transistors including gallium arsenide heterojunction transistors and to the use of these transistors in integrated circuit devices.

Since the invention of the transistor refinements have been continually made to reduce both its size and to increase its speed of operation. For many years silicon has been the element of choice utilized to construct transistors and IC devices. Recently silicon based logic gates have been demonstrated having sub-nanosecond speeds down to about 100 picoseconds.

Gallium arsenide was suggested as a potential transistor material long prior to the development of technology allowing its actual use as transistor material. With the advent of liquid phase epitaxy it became possible to construct gallium arsenide transistors. However, since this technology had inherent limitations therein, advances in gallium arsenide transistors lagged behind those being made in silicon base devices.

Heterojunction transistors were also suggested not long after the advent of the transistor. As with gallium arsenide transistors, again the transformation of theory to practical heterojunction transistors has been inhibited by the lack of practical methods for constructing such heterojunction transistors.

Two technologies have emerged which allow for the preparation of both gallium arsenide and heterojunction transistors. These are molecular beam epitaxy, hereinafter referred to as MBE and metal-organic chemical vapor deposition, hereinafter referred to as MOCVD. These two techniques allow the fabrication of gallium arsenide devices and certain heterojunction devices.

In MBE a wafer of a substrate is placed in a reactor which comprises a vacuum chamber. Elements to be deposited upon the wafer are heated to vaporize them and under the control of a mechanical shutter they are released toward the wafer. The vaporized atoms land on the substrate and arrange themselves in an epitaxial layer growing on the substrate. Doping is done by introducing dopant atoms also as a vapor. As opposed to MBE, in MOCVD generation of a high vacuum is not necessary. In this technique organometallics and hydrides are utilized as carrier molecules and are introduced as gases into a reaction chamber. Within the chamber the gases contact a substrate. Atoms are deposited by the gases onto the substrate to epitaxially grow the desired layers thereon.

Gallium arsenide based logic appears to have an inherent speed advantage of approximately 2 to 5 over silicon based logic. This has led to the development of certain gallium arsenide devices, most particular gallium arsenide FET's, i.e., field effect transistors.

Heterojunction gallium arsenide devices hold the promise of even higher speeds than gallium arsenide devices. Gallium arsenide heterojunction FET's have been demonstrated. Additionally, in order to achieve faster switching speeds, both high electron mobility transistors (HEMT) and certain heterojunction bipolar transistors have been constructed. Both of these devices have the theoretical potential for switching speeds below 20 picoseconds at reasonably low power levels and each only requires optical photolithography in order to build the devices.

Contrary to the heterojunction bipolar devices, the HEMT devices must be cooled to below about 100 K. to achieve optimum performance. Because of this cooling requirement these HEMT devices are not suitable in many environments. Because of their potential speed and ability to operate at room temperature or higher, bipolar gallium arsenide and bipolar heterojunction gallium arsenide devices are desirable. A further advantage of such bipolar devices is that they can utilize existing libraries of circuit designs which have been developed for emitter coupled logic (ECL) or current mode logic (CML) silicon bipolar devices.

Kroemer, in the paper H. Kroemer, Proceedings of the IEEE, Volume 70, Number 1, Jan. 1982, suggested a heterojunction gallium arsenide device which utilized an inverted emitter architecture to circumvent the problem of having to make contact to a buried collector. In this device base and collector contacts are placed on one side of a substrate with the emitter placed on the opposite side of the substrate such that it is inverted with respect to the base and collector contacts. However, since the emitter contact is on the opposite side of the substrate from the base and collector contacts this architecture is not applicable to many circuit layouts.

A further heterojunction bipolar gallium arsenide transistor is known which utilizes a normal emitter upright structure. However, in this structure the base layer is continuous across the structure having been formed by epitaxy and is so heavily doped that it cannot be over-compensated to enable contacts to be brought to the surface. This design requires vias to be formed in the structure. Since via etching is preferential these vias must be oriented at a specific crystallographic direction and generally have retrograded sides. Further, the vias are deep with respect to the dimensions of the individual layers of the device. In view of this, subsequent metalization of the collector contact is difficult, and leads to reduction in the yield.

BRIEF DESCRIPTION OF THE INVENTION

In view of the above it is evident that there exists a need for new and improved planar bipolar transistors and for devices incorporating these transistors which overcomes the above mentioned problems and disadvantages. This invention is directed to new and improved bipolar transistors, integrated circuit devices utilizing these bipolar transistors. The devices are fully planar and therefore do not restrict the layout of metalization runs.

This is achieved in a transistor which has a substrate with a first, collector layer epitaxially formed on the substrate. A base region is implanted in the collector layer and then a second epitaxially layer is formed over the collector layer including the base region implanted therein. A contact region is implanted in the second layer between the surface of the second layer and the base region. This contact region surrounds and defines an emitter in the second layer enclosed within the contact region. A base ohmic contact is located on the surface of the second layer over and in contact with the base contact region. An emitter ohmic contact is located on the surface of the second layer in contact with the emitter region therein. A collector ohmic contact is located on the surface of the second layer in a position which is isolated from the emitter by the base contact region and makes electrical contact with the collector by utilizing the second layer as a contact pathway. Each of the base ohmic contact, the emitter ohmic contact and the collector ohmic contact lie essentially in a plane.

A plurality of the above planar transistors can be formed on a substrate and isolated on the substrate from one another. The respective ohmic contacts of the individual transistors can then be connected by metallization runs laid on an insulating layer formed over the entire array into functional integrated circuits. These functional circuits are then connected to pins, pads or other connectors for connecting the integrated circuit device to an external environment.

The above transistors can be formed as heterojunction transistors by forming a heterojunction between the first and the second layers as, for instance utilizing gallium arsenide for the first layer and overlaying it with a gallium aluminum arsenide layer to form the heterojunction. The base layer can be conveniently formed in the first layer utilizing ion implantation of the dopant ion into the first layer. The second layer can then be epitaxially grown over the first layer either as a homostructure or as a heterostructure.

A bipolar transistor can be formed by forming at least a first layer on a substrate. A base region is then implanted in a portion of the first layer followed by the formation of a second layer over the first layer including formation of the second layer over the implanted base region in the first layer. A base contact region is then formed in the second layer such that the base contact region extends through the second layer into said base region and makes electrical contact with the base region. As so formed the base contact region isolates a region of the second layer from the remainder of the second layer. An electrical contact to the base contact region is then formed on the surface of the second layer. A further electrical contact to the isolated region is also formed on the surface of the second layer. Additionally, a contact to the first layer is also formed on the surface of the second layer utilizing the second layer as a contact pathway to the first layer. This additional contact is formed in a position electrically isolated from the isolated region and its electrical contact.

Both the first and second layers can be advantageously formed utilizing epitaxy. Implantation of the base region into the first layer and implantation of the base contact region into the second layer can be advantageously achieved utilizing ion beam implantation. Self-alignment of certain elements of these transistors can be achieved by utilizing a further patterning layer over the second layer which includes a pattern of the base contact region. The base contact region is formed through this patterning layer followed by forming the base contact also through the patterning layer. The base contact can be protected by forming a dielectric material over the base contact through the patterning layer. Portions the patterning over the isolated region formed by the base contact region are then removed allowing for utilization of the dielectric material for self-alignment of formation of the electrical contact to the isolated region.

This invention will be better understood when taken in conjunction with the drawings wherein:

DETAILED DESCRIPTION

For the purposes of illustration of this invention heterojunction bipolar transistors will be described. A III-V transition put as a gallium arsenide - gallium aluminum arsenide transistor will be utilized for these illustrative purposes. It is recognized that the transistors of the invention, IC devices formed therefrom and the processes of the invention can be utilized for forming other III-V bipolar transistors, as for instance, homojunction transistors including gallium arsenide homojunction transistors.

For the purposes of this specification certain layers in the illustrative heterojunction transistors will be formed utilizing the MOCVD process for formation of epitaxial layers. Alternately, other equivalent technologies such as MBE could be utilized for the formation of these layers. Further, to avoid abrupt heterojunction and certain anomalies associated therewith, in the formation of heterojunction of the invention epitaxial growth will be graded from the heterojunction interface through a portion of the heterojunction material as, for instance, grading the aluminum content over the first 500 Angstroms of gallium aluminum arsenide epitaxial layer. The remainder of that layer will then be formed at a constant aluminum content.

Further, for the purposes of illustration of the invention, a NPN device will be illustrated. It is recognized that PNP devices could be formed by suitably doping the component layers of the device.

In a paper written by one of the inventors of this invention entitled Heterojunction Bipolar Transistors With Ion Implanted Bases, J. W. Tully, IEEE Electron Device Letters, Volume. EDL-7, No. 4, April 1986, ion implantation of zinc ions in epitaxially grown gallium arsenide layers was demonstrated. After implantation, the zinc implanted capless layer was high temperature annealed. Then a graded gallium aluminum arsenide emitter layer was epitaxially grown over the zinc implantation and the remainder of the gallium arsenide layer. A gallium arsenide contact layer was then epitaxially grown over the emitter layer. The test wafer was then photolithographically patterned and etched to form a mesa structure with the emitter on top and the collector on the mesa bottom. The emitter metalization was used as a mask and a via etched through the unmasked emitter material down to and revealing the base. The resulting nonplanar transistor was then tested.

These tests demonstrated that zinc ions could be successfully implanted into a first epitaxially grown layer, annealed and then a second epitaxial layer grown over the implantation region. This is in contrast to other heterojunction bipolar transistor processes which rely upon grown base layers which, because they are so heavily doped cannot be over compensated and require deep etch vias to reach the base layers.

Figure 2:
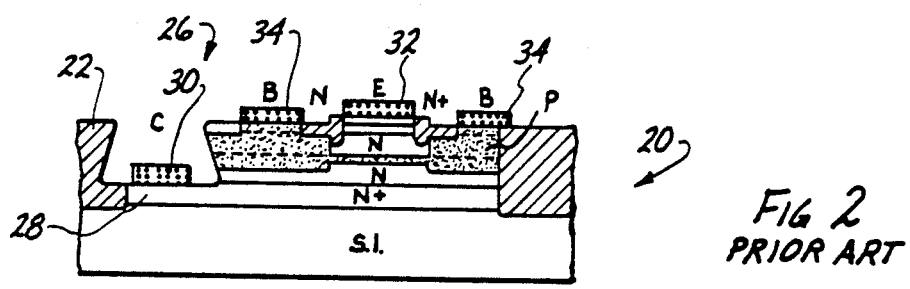
FIG. 2 is a cross sectional view of a prior art normal emitter up nonplanar mesa bipolar transistor.

FIG. 2 shows such a prior heterojunction bipolar transistor generally denoted by the reference numeral 20. Prior to the formation of the device isolation zones, collectively identified by the numeral 22 on either side of the device 20, a p doped base layer 24 extended completely across the wafer. Since this layer 24 is highly doped and cannot be over compensated it requires the formation of via 26 in order to reach the collector layer 28. The collector contact 30 is located at the bottom of the via 26 in contact with the collector layer 28. An emitter contact 32 and base contacts collectively identified by the numeral 34 are elevated with respect to the collector contact 30 and as such the device 20 is a nonplanar device.

Because the etch necessary to construct the via 26 is preferential along specific crystallographic directions the walls of the via 26 are reentrant and are retrograded. This combined with the depth of the via 26 makes metalization of the collector contact 30 very difficult.

Figure 1:
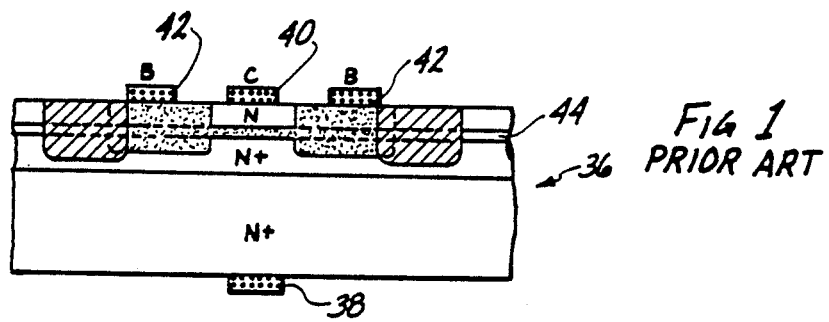
FIG. 1 is a cross sectional view of a prior art inverted emitter bipolar transistor.

A further prior art device generally depicted in FIG. 1 utilizes an inverted emitter structure. Thus, an emitter contact 38 is placed on the opposite side of the wafer from a collector contact 40 and base contacts, collectively identified by the numeral 42. By placing the emitter contact 38 in an inverted configuration the necessity of using deep vias to get through the base layer 44 is bypassed. However, a non-planar consequence of the structure is that the emitter contact 38 is located on the opposite side of the device 36 from the collector contact 40 and the base contacts 42.

Referring now to FIGS. 3 through 16, the step wise formation of a transistor of the present invention will be shown moving through the respective figures. Both a partially completed transistor and a completed transistor are generally be indicated by the numeral 46. For purposes of brevity, not all of the particular layers of the transistor 46 are illustrated in every Figure.

Also dimensions of the particular layers and components formed thereon are not drawn to scale, but, in certain instances, may be exaggerated for clarity.

Figure 3:
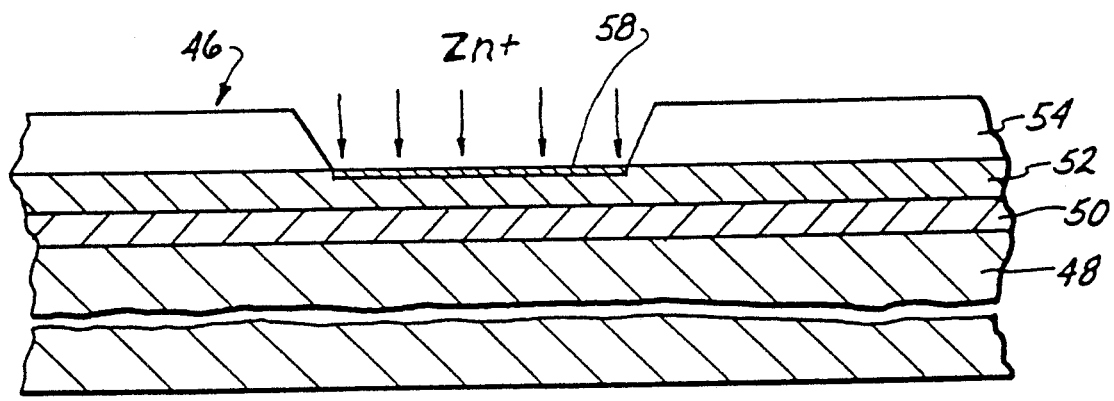
FIG. 3 is a cross sectional view through a prepared semiconductor wafer having certain layers thereon and showing implantation ion pathways.

The first layer depicted in FIG. 3 is a semi-insulating gallium arsenide substrate 48 such as a semi-insulating commercially available gallium arsenide wafer of a normal thickness of about 0.0016 inches and polished on both sides such that further layers can be epitaxially grown thereon. The substrate 48 is loaded into an MOCVD reactor and an n+ gallium arsenide subcollector layer 50 is epitaxially grown thereon. Next an n gallium arsenide collector layer 52 is epitaxially grown in the reactor on top of the sub collector layer 50.

Layers 50 and 52 will be collectively identified as the "first layer". Whenever this "first layer" includes dopants for electrical activity within the layer, it may also be referred to as an "active first layer".

The collector layer 52 is grown thicker than the sub collector 50, as for instance 0.1 microns thicker, than the sub collector 50 so that the difference can be utilized in the formation of a base on the collector layer 52.

A resist 54 is laid on the collector layer 52 and is patterned at 56 with a window which defines a base ion implant region. Zinc ions are implanted through the window 56 into the collector layer 52 to form a base layer 58 or "base region". The base layer 58 also can be considered as a "control region" in the above referred to "first layer".

Ion implantation is done in an appropriate ion implantation system operated at about 70 keV for zinc ions. The base layer 58 resulting therefrom exhibits high dopant concentration in a thinly doped base region of about 0.12 microns thick. Concentrations of dopant ions of about $3 \times 10^{16}$ cm$^3$ are achieved.

Alternatives to the use of zinc ions for base implantation, include cadmium, magnesium and beryllium. Since beryllium has a lighter mass than zinc it is expected that it will do less damage to the layer being implanted, however, for the base layer 58, it might be more likely to diffuse. Cadmium might be suggested as being more stable in high temperature conditions, and, being larger than zinc, it might be less prone to diffuse. Nevertheless, zinc is presently preferred for the ion implant of the base layer 58.

After removal of the resist 54, transistor 46 (FIG. 3), is reinserted into a MOCVD reactor where it is high temperature annealed, preferably about 920° C. for about 5 minutes in order to remove damage sites within the base layer 58. Such damage sites can contribute to recombination of the carriers in the transistor.

While the high temperature anneal results in certain loss of the zinc ion dopant concentration, the initial concentration on ion implantation is sufficient such that, even after anneal, a high ion concentration remains in the base layer 58. As an alternative to the above described capless annealing step, a cap could be used over the base layer 58 during the annealing of the base implant to maintain higher base layer ion dopant concentration during the anneal.

It has been found that a cap of only 135 Angstroms of sputtered silicon nitride ($Si_3N_4$) is sufficient to retain all of the zinc ion implant while still maintaining activation of this implant.

Figure 4:
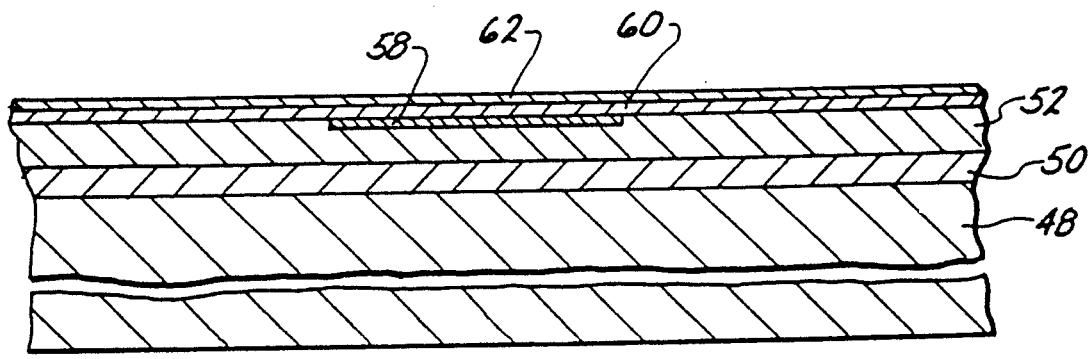
FIG. 4 is a view similar to FIG. 3 showing the wafer after further layers have been added to the wafer.

Referring now to FIG. 4, while still maintaining the transistor 46 in the MOCVD reactor, after formation of the base layer 58 in the collector layer 52 an n gallium aluminum arsenide emitter layer 60 is grown on top of the collector layer 52 and the base layer 58 formed therein. During growth of this gallium aluminum arsenide emitter layer 60, the aluminum concentration is graded over about the first 500 Angstroms of growth from 0 to about 0.30 aluminum content and then for the remainder of the layer the aluminum concentration is maintained at a steady level of about 0.30 aluminum content. The emitter is grown to a thickness of about 0.15 microns and a n+ gallium arsenide contact layer 62 is next epitaxially grown over the emitter layer 60.

Together the emitter layer 60 and the contact layer 62 can be considered as a "second layer" grown over the above referenced "first layer". As note above the "first layer" comprised the collector layer 52 and the control region or base layer 58 formed therein.

It has been found that the ion implantation of the base layer 58 into the collector layer 52 is not significantly disruptive such that the emitter layer 60 and the contact layer 62 can be epitaxially grown on top of the previously epitaxially grown collector layer 52.

Doping for the all of the above referenced n or n+ type gallium arsenide and gallium aluminum arsenide layers is generally done using silicon as the dopant atom. As an alternative to silicon, other group VI elements, with the exception of oxygen, can be used. Thus the n type dopant group includes silicon, sulfur, selenium, and tellurium atoms.

Figure 5:
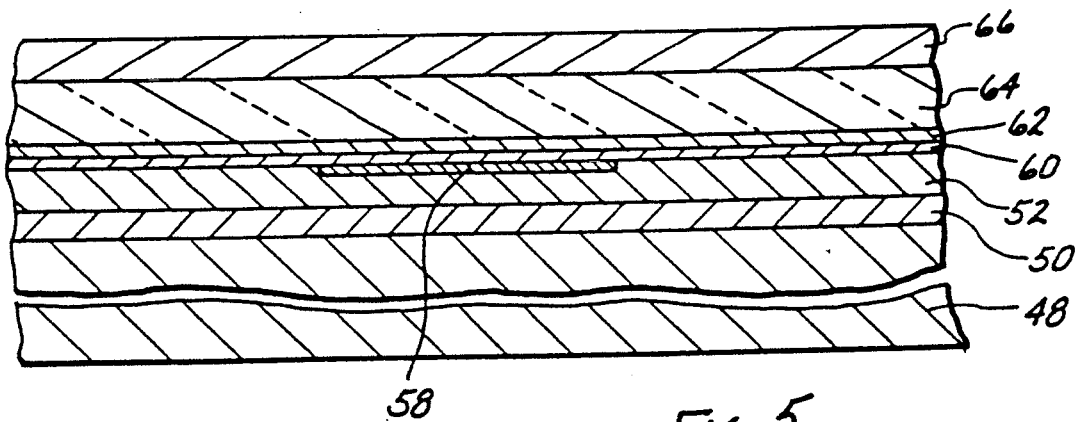
FIG. 5 is a view similar to FIG. 4 except additional layers have been added to the wafer.

Referring now to FIG. 5, next a silicon dioxide layer 64 is sputter deposited on top of the contact layer 62. This is followed by sputter depositing an aluminum layer 66 on top of the silicon dioxide layer 64. These layers are sputter deposited to a thickness of about 0.4 microns each. A photoresist 68 is layered over the aluminum layer 66 and a base contact pattern is photolithographically reproduced in this resist layer 68.

The aluminum layer 66 is etched utilizing a commercial phosphoric acid etch ($H_3PO_4$). The silicon dioxide layer 64 is then RIE etched utilizing a $NF_3/Ar$ etch and the aluminum layer 66 as a mask. This $NF_3$ etch is a quasi anisotropic etch at a first pressure which does not cause polymerization and does not react with the aluminum mask.

The silicon dioxide layer 64 is then etched again using an isotropic etch also utilizing $NF_3$ at a higher pressure. This etch is very controllable and can be timed to achieve a controlled 0.2 micron undercut of the aluminum mask. Ultimately as will be seen below this 0.2 micron undercut defines the base emitter separation allowing for a base emitter separation of 0.2 microns while utilizing 2 micron photolithography design. Because of this 0.2 micron base emitter spacing a base emitter parasitic diode can be inhibited resulting in improved performance of devices.

For the isotropic etch of the silicon dioxide layer 64 to undercut the aluminum 66, alternately either $NF_3/Ar$ or $CF_4/O_2$ can be utilized. Presently it is preferred to use the $NF_3/Ar$ etch since the etching parameters are better controlled using this etch.

Figure 6:
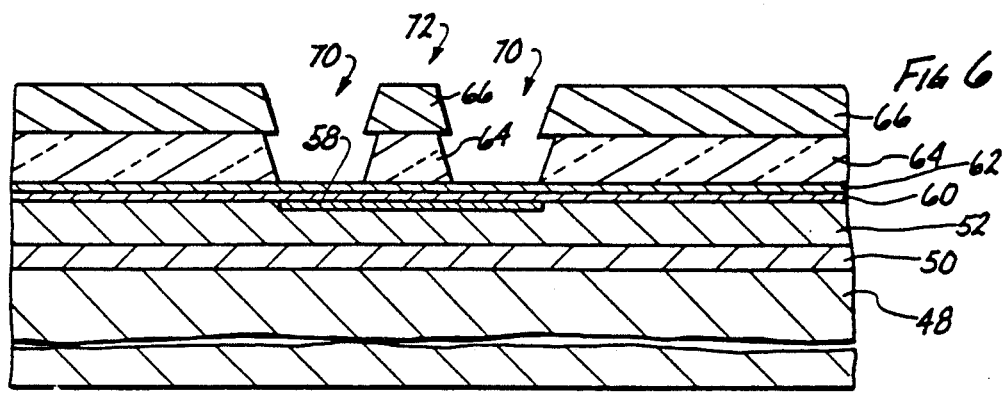
FIG. 6 is a view similar to FIG. 5 showing patterning and removal of areas of the top layers of the wafer.

In FIG. 6, a window 70 has been opened through the aluminum layer 66 and the underlying silicon dioxide layer 64. As seen in FIG. 6, in the sectional view, this window 70 is seen as two separate windows, however, this window is continuous and seen in plan view would appear as a squared ring. Located in the center of the window 70 is an island 72 of silicon dioxide overlaid with aluminum which overlays what will ultimately become the emitter of the transistor 46.

Figure 7:
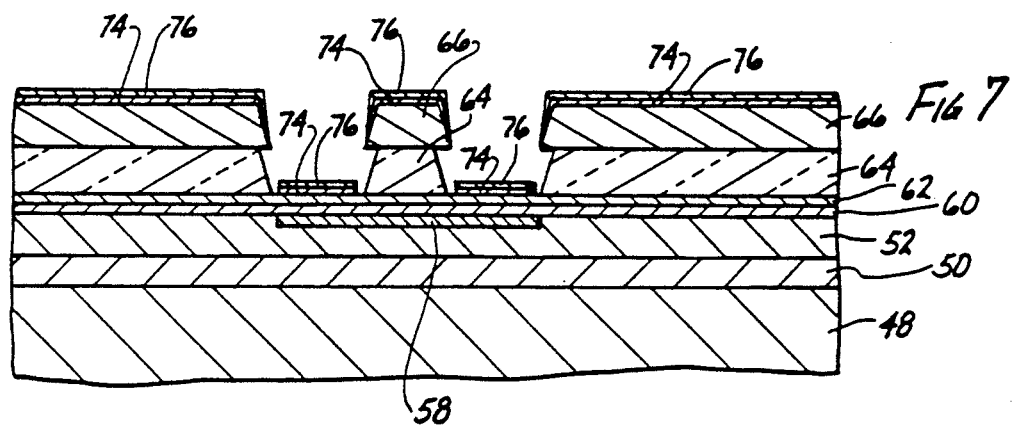
FIG. 7 is a view similar to FIG. 6 showing implantation of material in exposed layers.

Referring now to FIG. 7, base contact metalization for formation of base ohmic contacts are made by E-beam evaporation first of a refractory metal such as molybdenum to form a layer 74 followed by passivization of this metal with a chromium layer 76. The chromium layer 76 serves as a passivization layer against a later $CF_4/O_2$ etch.

Figure 8:
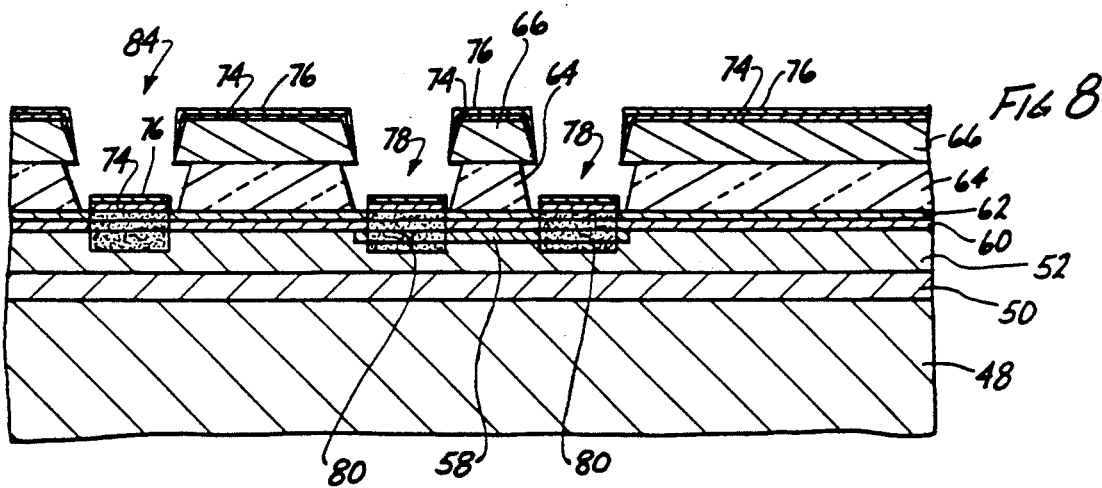
FIG. 8 is a view similar to FIG. 7 showing patterning and exposure of further areas and metalization layers added thereon.

Referring now to FIG. 8, a further ion implantation through the window 70 forms a contact layer or connecting region through the "second layer", i.e. the emitter layer 60 and the contact layer 62, to the buried base layer 58. It thus extends from the "base" or "control zone" up through the "second layer" to the surface of the second layer.

This further ion implantation is done utilizing a beryllium ion implantation which is effected through the molybdenum chromium layers 74 and 76. Alternative to a beryllium ion implantation would be a high energy zinc icon implantation, for instance zinc implantation at 200 keV. However, since the less massive beryllium ions are capable of implanting at a lower energy, beryllium ion implant formation of the contact region to the base layer 58 can be done at a lower energy.

At this time the island 72 protects the material which will ultimately become the emitter. This emitter material lies below the island 72 and is protected during the p type ion implantation such that the emitter material retains its integrity as n type material.

In utilizing beryllium as the implant ion for the base contact region it has been noted that beryllium, since it is a much lighter ion does not induce as great a degree of damage as zinc does and because of its lightness it is implanted at much lower energies. This also reduces damage further. Additionally, we have found that beryllium can exhibit higher $\beta$'s by a factor of about 2 over similar zinc implanted base contact regions.

The molybdenum layer 74 and the protective chrome layer 76 thereon form a base ohmic contact 78. Alternatively to formation of this contact together with ion implantation to connect this contact to the base layer 58, the implantation step can be effected first followed by the formation of the base ohmic contact 78 over it. In any event, a base contact region 80 is formed between the base ohmic contact 78 and the buried base layer 58. As with the window 70 this base contact region 80 is shaped somewhat as a squarish ring.

The base contact 80 serves as a contact or extension region from the surface of the "second layer", i.e. the emitter layer 60 and the contact layer 62, to the buried control region, i.e. the base layer 58. Further, it serves to define an isolated region (located under the island 72) which ultimately will become the emitter of the transistor 46. This isolated region is isolated by the base contact region 80 from the remainder of the "second layer" and thus ultimately the remainder of the "second layer" can be utilized for electrical conduction, i.e. a "conduction pathway", to the buried collector layer, i.e the "first layer", as hereinafter described without affecting the "isolated region", i.e. the emitter, underneath the island 72.

While not forming a portion of the transistor 46, a first layer metalization can be formed on the surface of the second layer, i.e. directly over the contact layer 62 by either concurrently etching with the window 70 or etching in a further step a further window 82. The window 82 is displaced outwardly from the layers which will ultimately form transistor 46 and will ultimately be isolated from it utilizing isolation techniques. If the window 82 is utilized, concurrent with metalization of the molybdenum and chromium layers 74 and 76 a first layer metalization runner 84 can be located in the window 82.

If metalization of the base ohmic contact 78 is done prior to ion implantation of the base contact region 80 and simultaneously with metalization of the base contact 78, a first layer metalization runner 84 is concurrently formed with the ohmic contact 78. During ion implantation to form the base contact region 80 a similar ion implantation would occur underneath the runners 84. Since the runners 84 ultimately will be isolated from other areas on the wafer the ion implantation underneath such runners 84 has little effect and while we do not wish to be bound by theory, it is believed that it attributes to better performance of the runners 84 by having the implantation area underneath them. In view of this, alternately the metalization for the ohmic contact 78 and the runners 84 can be laid down prior to o after ion beam implantation to form the base contact region 80.

Concurrent with layering of the molybdenum layer 74 and chromium layer 76 in the windows 70 and 82 the molybdenum and chromium are also overlaid on the top surface of the aluminum layer 66. However, because this metalization is done utilizing a thermal evaporation deposit technique, i.e. E-beam evaporation, the metalization is only effective in a straight line directly below the windows 70 and 82 and no metalization is deposited on the undercut sides of the silicon dioxide layer 64 within the window 70 (or the sides of window 82 if they also are formed with an undercut). While we do not wish to be bound by theory, it is also believe that this directional metalization could also be achieved via sputtering. Because the silicon dioxide layer 64 was undercut via the isotropic etch with respect to the size of the window 70 in the aluminum layer 66 and since the metalization of the molybdenum and chrome layer 74 and 76 is only directly underneath the window 70, the 0.2 micron spacing of the undercut is preserved and it will ultimately form a separation between the base and emitter which will be utilized to reduce the parasitic capacitance of base collector and base emitter.

Figure 9:
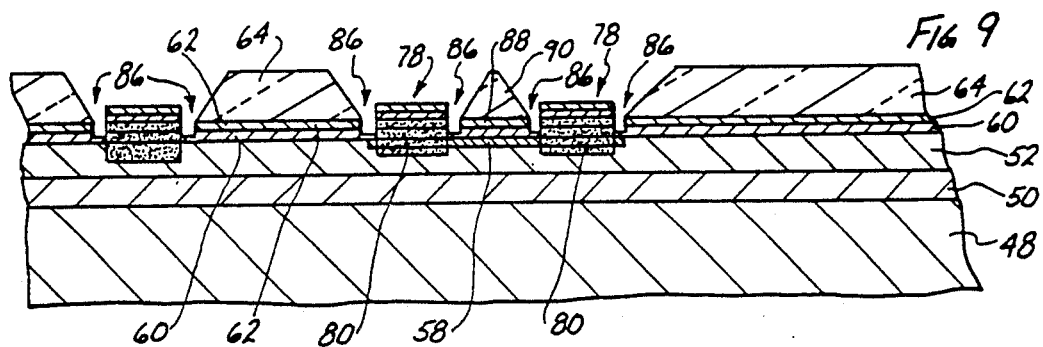
FIG. 9 is a view similar to FIG. 8 showing the removal of the top layer of the wafer.

The aluminum layer 66 is now lifted off of the remainder of the transistor 46. The result of this is seen in FIG. 9. Along with lift off of the aluminum, any metalization of the molybdenum layer 74 and the chrome layer 76 deposited on the aluminum layer 66 is also removed with the aluminum. The aluminum layer is removed utilizing an etch in 50% potassium hydroxide (KOH). This lift off procedure proceeds very rapidly due to the stress of the Mo/Cr layers. The base ohmic contacts 78 and the metalization runner 84 however, are inert to the KOH etch and it does not effect them. As the aluminum is dissolved the overlaying Mo/Cr is floated away. This etch of the aluminum layer is sufficiently fast, occurring in about 5 to 30 minutes, that no significant etching of the gallium arsenide layers occurs.

After liftoff of the aluminum layer and any metalization adhering to the top thereof the separation of the base ohmic contacts 78 from the silicon dioxide layer (i.e. the above referred to 0.2 micron separation) is exposed. The transistor 46 as seen in FIG. 9 is now sputter etched. This does two things. The first of which is to form trenches collectively identified by the numeral 86 through the contact layer 62 and into the emitter layer 60. This opens up an approximate 0.2 micron space between the p type base contact region 80 and the portion of the gallium arsenide contact layer 62 seen in the center of FIG. 9 directly underneath the silicon dioxide pyramid 90 which is separately identified in FIG. 9 by the numeral 88. This breaks an n+ gallium arsenide —p+ gallium arsenide parasitic diode formed between the material 88 and the base contact region 80. Breaking of this diode effects the recombination and gain of the device. Alternatively, ion bombardment of these areas can be suggested for breaking such a parasitic diode.

The second thing that happens with the sputter etch is cleaning of the surface by taking down some of the walls of the silicon dioxide layer such that as seen in FIG. 9 compared to FIG. 8 the exposed walls are taken away from a vertical to a more horizontal orientation and they end up with approximately a 45° slope. This will improve later metalization because it is much easier to lay a metalization run over these low sloping walls then higher vertical walls. This avoids thinning out and breaking of the metalization since it does not have to go over a steep wall and is laid down over a more planar surface.

Figure 10:
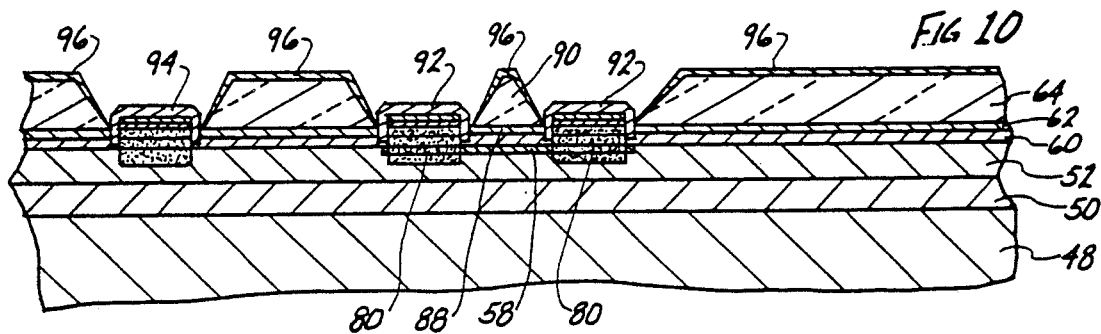
FIG. 10 is a view similar to FIG. 9 showing encapsulation of exposed areas of the wafer.

Next, as seen in FIG. 10 a silicon nitride ($Si_3N_4$) dielectric layer is sputter deposited. The silicon nitride goes down into the trenches 86 and over the base ohmic contact 78 to form caps 92 thereon. Further, at this time it also forms a cap 94 over the metalization runner 84. This passivates the base contacts 78 as well as the metalization runner 84. In filling the trenches 86 with the dielectric silicon nitride, the material 88 in the contact layer 62 is now fully separated by a dielectric material from the base contact region 80.

As is also noted in FIG. 10 there is a silicon nitride layer 96 over the surface of the silicon dioxide pyramid 90 as well as over the remainder of the surface of the silicon dioxide layer 64. The pyramid 90 with the layer 96 thereon stands upwardly from the well created in the silicon dioxide layer 64 which houses the base ohmic contact 78 with their cap layers 92 thereon. Advantage is taken of this in the next step as seen in FIG. 11.

Figure 11:
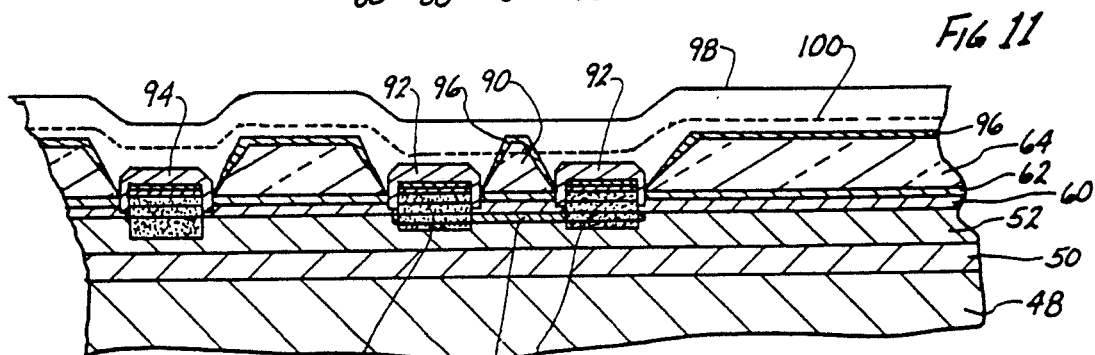
FIG. 11 is a view similar to FIG. 10 showing the addition of material over the wafer.

A layer of a suitable resist as for example a dilute layer of PMMA (polymethyl methacrylate), is overlaid as is defined by the solid line for element 98 in FIG. 11. Prior to overlaying the PMMA as the layer 98, it is thinned utilizing an appropriate commercial thinner for this material such that it will flow across the surface of the wafer. Upon applying the thinned PMMA layer 98 it is allowed to reflow into the well wherein the ohmic contact 78 and the pyramid 90 are located. This layer 98 of PMMA is then RIE etched utilizing an 02 plasma. This erodes the PMMA at a uniform rate no matter where it is on the surface of the wafer.

Because the PMMA was thinned and allowed to reflow, it piled up over the base ohmic contact 78. As it erodes, the top of the pyramid 90 is exposed as is seen in the phantom line 100 of FIG. 11. At this point while silicon nitride layer 96 on pyramid 90 is exposed the silicon nitride caps 92 on the base ohmic contact 78 are still protected by being buried underneath the PMMA. Also the silicon nitride cap 94 on the metalization runner 84 and the silicon nitride layer 96 on the remainder of the silicon dioxide layer 64 are also still buried within the PMMA layer and are protected.

Etching of the PMMA is stopped at a point wherein this layer is still overlays the caps 92 but has exposed the top of the pyramide 90. By utilizing very thin PMMA such that the layer 98 was of the order of about 2500 Angstroms preferential etching of this layer can be achieved.

Figure 12:
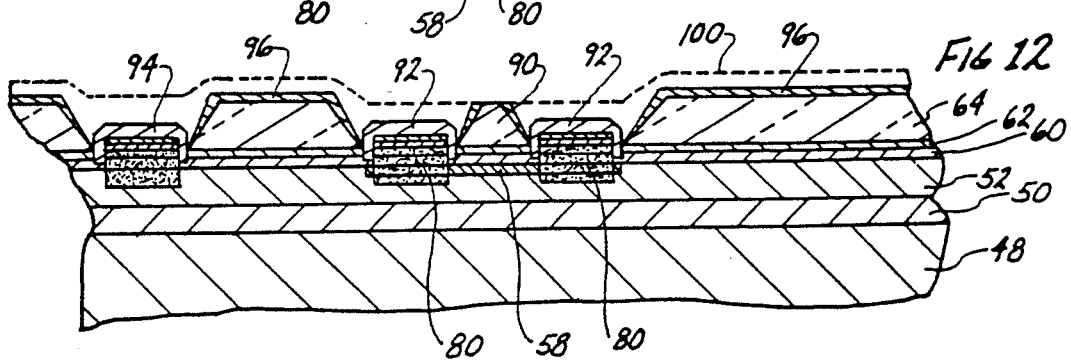
FIG. 12 is a view similar to FIG. 11 showing removal of material exposed after treatment of the layer added in FIG. 11.

A positive photoresist is then applied and the emitter contact area opened in it. A $CF_4/O_2$ plasma is then used to etch away the silicon nitride layer 96 on the pyramid 90. The silicon nitride caps 92 and 94 on the base ohmic contacts 78 and metalization runner 84 and the silicon nitride layer 96 on the remainder of the silicon dioxide layer 96, however are protected from this etch by the PMMA. FIG. 12 shows the results of this etch wherein the silicon nitride top of the silicon dioxide pyramid 90 has been etched away exposing the silicon dioxide material of the pyramid 90.

Figure 13:
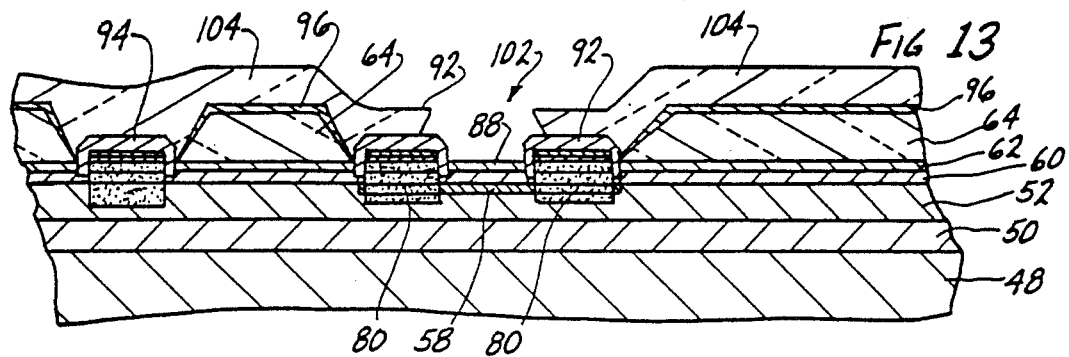
FIG. 13 is a view similar to FIG. 12 showing overlaying of certain portions of the wafer with a resist.

The silicon dioxide of the pyramid 90 is now etched away utilizing a commercial BOE etch which exposes an emitter metalization window area 102 seen in FIG. 13. The remainder of the photoresist and PMMA are then removed and the emitter mask reapplied with a resist. This resist is now treated utilizing a chlorobenzene liftoff process which is known in the literature. This lift off process creates a lip on the resist layer 104 as is seen in FIG. 13. Realignment of the emitter mask at this time is not super critical because of the presence of the silicon nitride caps 102 over the base ohmic contacts 78. These caps 102 make the emitter area self aligning.

As can be seen in FIG. 13 the gallium arsenide contact layers material 88 in the emitter metalization window 102 is exposed with the window 102 being defined by the caps 92 surrounding it. Thus, emitter metalization can proceed in a self aligning step wherein the caps 92 control placement of emitter metalization directly on the material 88.

Figure 14:
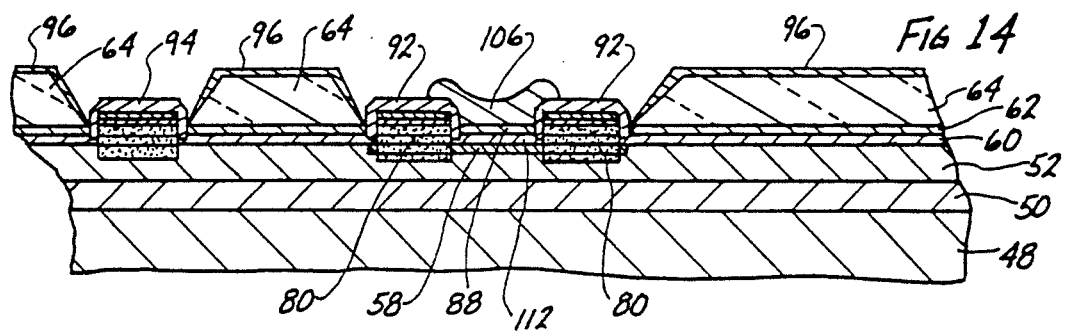
FIG. 14 is a view similar to FIG. 13 showing formation of an ohmic contact on a portion of the wafers.

Emitter metalization is effected to deposit an emitter ohmic contact 106 seen in FIG. 14. This contact is deposited utilizing a gold germanium/nickel/gold layer (AuGe/Ni/Au).

The gold germanium/nickel/gold metalization of the emitter contact 106 is separated from the base ohmic contact 78 by the silicon nitride caps 92 over the base ohmic contact 78. Thus these two contacts are insulated from one another. Exact critical placement of the emitter mask is not necessary because of the self alignment feature achieved by having the silicon nitride caps 92 surrounding the area of the emitter contact 106. Thus, there is a certain degree of variability in the registration of the emitter mask for effecting the metalization of the emitter contact 106.

Next the collector contact is effected. A resist is placed over the surface of the wafer and collector windows are opened in the resist. The silicon nitride layer 96 over the collector layer is etched using a $CF_4$ plasma etch and then the silicon dioxide layer 64 underneath is etched utilizing a BOE etch. This opens a collector window 108 seen in FIG. 15. The silicon nitride edges around this window 108 are then back etched utilizing a $CF_4/O_2$ etch. Collector metalization is then effected also utilizing a gold germanium/nickel/gold layer to lay down a collector ohmic contact 110. The collector metalization 110 and the emitter metalization 106 are then simultaneously alloyed at about 425° C. for 5 seconds.

Figure 15:
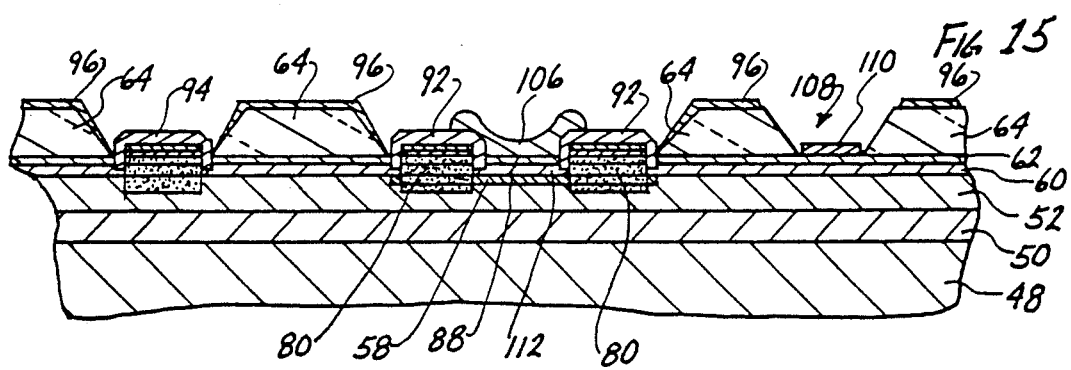
FIG. 15 is a view similar to FIG. 14 showing the formation of further patterning and exposure of additional layers of the wafer.

As is evident from FIG. 15 at this time the planar nature of this process is present. The base ohmic contacts 78, the emitter contact 106 and the collector contact 108 all lie in essentially the same plane. No vias will be necessary on subsequent metalization of these contacts since they in fact all are in the same plane.

The collector contact 110 conducts through the "second layer", i.e. the above noted emitter layer 60 and the contact 62, to the "first layer", that is the gallium arsenide collector layer 52. The "second layer" thus forms a conduction pathway to the "first layer". The actual emitter portion 112 of the layer 60 underneath the metalization 106 is isolated from the remainder of the "second layer", i.e. the layers 60 and 62, by the base contact region 80 which completely surrounds it to isolate it as an island. An NPN bipolar transistor 46 is thus completed between emitter material 112, base layer 58 and collector layer 52. This bipolar transistor is completely different from other known gallium arsenide, gallium arsenide - gallium aluminum arsenide or the like known bipolar transistors in that its ohmic contacts are all in the same plane and are not located either on opposite sides of a wafer or in deep vias.

The transistor 46 thus formed is now isolated from other components by ion bombardment at the areas collectively identified by the numeral 114 to electrically neutralize material between devices. This isolation is effected by proton bombardment utilizing plated gold as a proton mask. Normally a two micron thick layer of gold serves as the mask with proton implantation effected in three doses at energies of 100, 200 and 300 keV to achieve a uniform dose of protons throughout the material. This produces device isolation of greater than $10^7$ ohms. Boron and oxygen can also be suggested as potential elements for the bombardment ions for device isolation.

After or prior to isolating individual transistors, such as a transistor 46 other devices can be also built on the surface of the wafer, as for instances forming a resistor by first utilizing a CF4/02 etch of the overlying silicon nitride 96 layer followed by nickel chromium evaporation through a photoresist.

Figure 16:
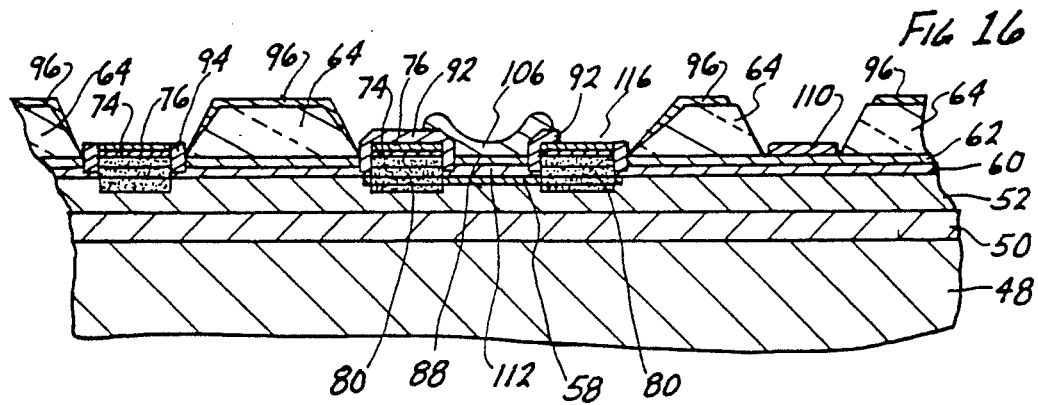
FIG. 16 is a view similar to FIG. 15 showing exposure of additional structures in the wafer.

Base holes in the silicon nitride cap 92 are now open utilizing a $CF_4/O_2$ etch such that the base ohmic material 78 is exposed as is seen at area 116 in FIG. 16. Simultaneously at this time openings 118 are also formed over the metalization runner 84.

Figure 17:
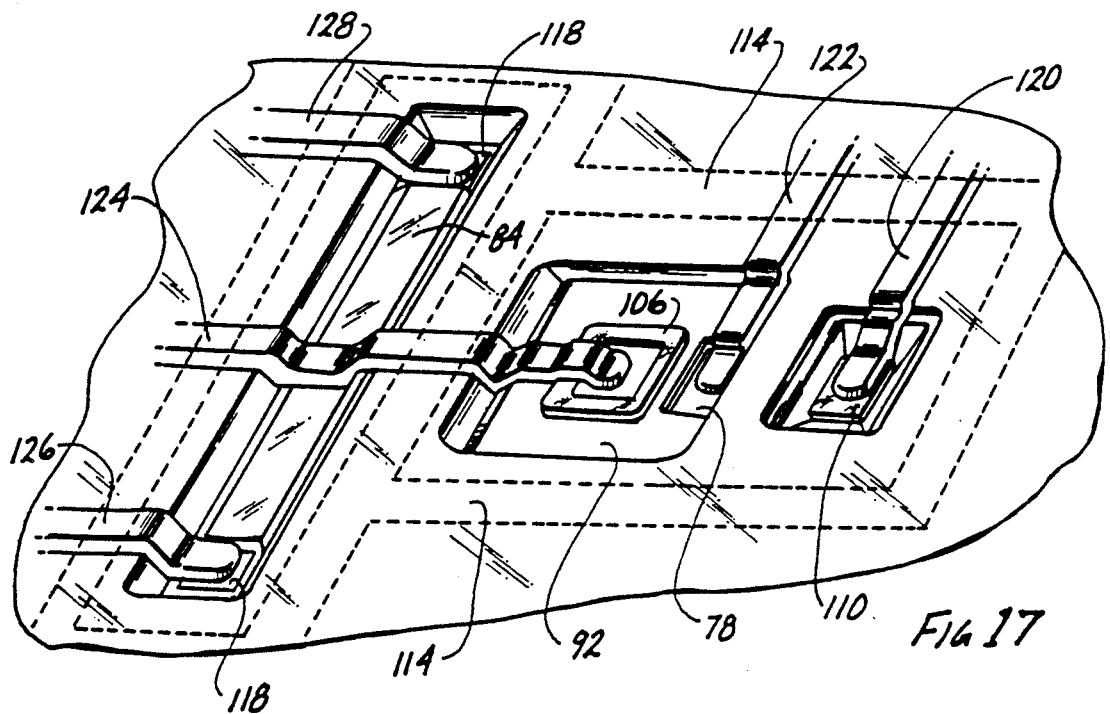
FIG. 17 is an isometric view of the top surface of a wafer having the structure of FIG. 16 located therein.

Referring now to FIG. 17, the base contact area 116 exposes the top of the base ohmic contact 78 and openings both collectively identified by the numeral 118 expose the metalization runner 84. Circuit metalization is now effected to connect the transistor 46 to functional circuits on the wafer. Thus, the collector is connected to circuits via metalization run 120, the base via metalization run 122 and the emitter via metalization run 124. Further metalization runners 126 and 128 are connected to the buried metalization runner 84. Useful for metalization runs 120, 122, 124, 126 and 128 would be titanium gold or the like. This is put on utilizing a suitable mask and resist.

As seen in FIG. 17 the metalization run 124 crosses over the buried metalization runner 84. Thus, also inherent in the device of the invention is both a first metalization layer, i.e. the runner 84, which is inherently isolated from a second layer of metalization, i.e. the runners 120 through 28. This facilitates formation of circuit element designs in integrated circuits which are fabricated utilizing a plurality of transistors 46, each formed in equivalent manner as described and interconnected into functional integrated circuits on a wafer including additional elements such as nickel chromium resistors and the like. Bridges are automatically created over molybdenum chromium metalization runners which are buried and which are simultaneously formed when the base ohmic contact 78 was formed.

Heterojunction bipolar transistors utilizing the above structure and processes have been implemented into a variety of integrated circuit devices such as ring oscillators, dividers and the like without the use of deep vias and without regard to crystallographic orientation in their preparation.

As shown in FIGS. 9-17, the trench 86 completely isolates the emitter located under emitter metalization 106 from the base area which is located underneath the base silicon nitride caps 92.

Alternately to isolating the emitter as an "island" in the base as has been described, the emitter could be located on one side of the base and then isolated by ion bombardment around the remainder of its periphery. Such a construction would also serve to isolate the emitter from the remainder of the "second layer" material allowing this "second layer" material to serve as the conduction pathway to the collector. Suitable ion bombardment would be proton bombardment as described above.

Finally, to complete an integrated circuit device an appropriate wafer having transistors as per the transistors described above would be trimmed, mounted in an appropriate support structure and equipped with pins, pads or other similar connectors utilized to connect the integrated circuit device to its outside working environment.

The transistor described above was able to achieve a 0.2 micron spacing between the emitter base while still utilizing photolithographic processes relying on line spacing of 2 microns, i.e. 2 micron design rules. The self aligning of the emitter base allows this to be possible while still working well within the realm of optical lithographic processes. Thus, as noted in the examples below, utilizing 2 micro design rules, a 2.5 micron×2.5 micron emitter devices is constructed. Utilizing 1 micro design rules, as 1 micron×1 micron emitter device can still be constructed utilizing optical lithographic processes. A log reduction in size of the line spacing can be suggested utilizing electron lithographic processes.

Further, the device of the invention have an inherent second level of metalization built in and the top metalization utilized to connect the devices in circuits and the like need only traverse plateaus, i.e. the edges of the silicon dioxide, which are of an order of 3,000 to 5,000 Angstrom instead of in the micron domain and which might also include having to traverse micron domain retrograde walls.

Gallium arsenide and gallium arsenide - gallium aluminum arsenide bipolar transistors have been utilized for illustrative purposes herein. Other group III - group V materials might also be used for the construction of transistors of the invention. Thus with aluminum and gallium, indium can be suggested as a further group III material and with arsenic, phosphorus and antimony as further group V materials.

EXAMPLE 1

A 0.0016 inch thick semi-insulated gallium arsenide wafer polished on both sides was loaded into an MOCVD reactor (Crystal Specialties Model 410A). A gallium arsenide subcollector layer was epitaxially grown thereon to a thickness of about 0.5 microns. During growth of this layer it was doped with silicon at about $3 \times 10^{18}$ cm$^3$ to create an n+ gallium arsenide layer. A collector layer was then epitaxially grown to a thickness of about 0.6 microns. The collector layer was doped with silicon at about $1.5 \times 10^{16}$ cm$^3$ to form an n gallium arsenide collector layer. After placing a layer of photoresist on the wafer and exposing it to open up the base windows, the wafer was transferred to a commercial ion implant device and zinc ions were implanted at room temperature to a concentration of about $3 \times 10^{18}$ cm$^3$ and to a depth of about 0.12 microns. This implantation was done at 70 keV utilizing the photoresist to define the window for the base layer.

The photoresist was removed and the wafer reinserted into the MOCVD reactor. It was annealed at 920° C. for 5 minutes immediately followed by the growth of a gallium aluminum arsenide layer to a thickness of about 0.15 microns. The initial 500 Angstroms of this layer was graded in aluminum content from 0.0 to 0.30 aluminum content. This layer was also doped with silicon ions to a dopant concentration of $1 \times 10^{18}$ cm$^3$ to form an n gallium aluminum arsenide layer. Next a gallium arsenide contact layer was grown to about 0.15 microns at a silicon dopant concentration of $3 \times 10^{18}$ cm$^3$.

The wafer with the epitaxially grown layers and ion implanted areas thereon is now sputter deposited first with a layer of silicon dioxide and then a layer of aluminum each to about a thickness of 4,000 Angstroms. A base pattern is then defined with photoresist and the aluminum etched in a commercial phosphoric acid etch. The silicon dioxide is first etched with a NF$_3$/Ar etch at 0.2 torr using the aluminum mask and then an isotropic re-etch utilizing NF$_3$/Ar at 0.35 torr for a time period to achieve a controlled 0.2 micron undercut of the aluminum mask. Since this second isotropic etch is quite slow the etch is simply timed and checked by a scanning electron microscope to achieve the desired 0.2 micron undercut.

Base contact metalization is then effected utilizing a commercial E-beam evaporator. The substrate wafer was preheated in the evaporator to 140° C. for one half hour. Molybdenum was then evaporated to a thickness of about 400 Angstroms followed by evaporating a layer of chromium over the molybdenum to a thickness of about 500 Angstroms.

The wafer was then transferred back to the ion implant chamber and a beryllium ion implant effected at 35 keV at room temperature to form the base contact to the base layer doped at $3 \times 10^{19}$ cm$^3$ in the gallium arsenide layer and $2 \times 10^{19}$ cm$^3$ in the gallium aluminum arsenide layer.

The aluminum layer and extraneous molybdenum chromium located on the aluminum is then lifted off utilizing a 50% KOH/H$_2$O solution. This is completed within about 30 minutes.

The wafer was then sputter etched to form trenches adjacent to the base contact regions and to plane remaining silicon dioxide edges to a more horizontal slope. This was followed by silicon nitride sputter deposition including filling of the trenches with silicon nitride. The beryllium ion implant was then rapidly annealed at 800° C. for 5 seconds.

A dilute PMMA layer was then spun onto the surface of the wafer to a thickness of about 2500 Angstroms and allowed to reflow in the areas over the base contacts.

The PPMA layer was then RIE etched in an oxygen plasma atmosphere. A positive photoresist was applied and emitter contacts opened in it. The silicon nitride layer over emitters was then plasma etched in a $CF_4/O_2$ plasma followed by etching of exposed silicon dioxide in a BOE etch. Emitter metalization was completed utilizing gold germanium/nickel/gold followed by lift off of the excess metal by soaking in acetone to lift the metal off on top of the photoresist mask. Base contacts were then annealed at 450° C. at 5 seconds in a halogen rapid thermal annealing unit (a RTA device).

A resist was laid over the wafer and collector windows opened through the resist. These windows were etched utilizing a $CF_4/O_2$ plasma to etch off the silicon nitride followed by a BOE etch of the exposed underlying silicon oxide. Collector contacts were then applied utilizing evaporation of gold germanium/nickel/gold and both the collector and the emitter contacts alloyed at 425° C. for 5 seconds in RTA device.

Individual devices were then isolated by proton implantation at 100, 200 and 300 keV utilizing a 2 micron thick gold mask to protect the individual devices. Device interconnection metalization was evaporated by utilizing titanium gold evaporated through an appropriate photoresist mask.

EXAMPLE 2

An IC device was fabricated by fabricating individual transistors utilizing the process of Example 1 above. In this device the emitter was 2.5×2.5 microns square. It showed a differential gain ($\beta$) of 25 to 50 at base currents of 0.1 mA. Emitter and collector resistance were approximately $5\times10^{-6}$ ohm-cm$^2$. Base resistance was $5\times10^{-7}$ ohm-cm$^2$. Gate delay was approximately 115 picoseconds as measured on a 17 stage ring oscillator. A divided by 2 IC device was operated at from about 30 MHz to about 1850 MHz with a power consumption of about 240 milliwatts.

The invention illustrated in the drawings and described in this specification utilizes certain principles and/or concepts as are set forth in the claims appended hereto. Those skilled in the material science and electronic arts to which this invention pertains will realize that these principles and/or concepts are capable of being utilized in a variety of embodiments which may differ from the exact embodiments utilized for illustrative purposes herein. For this reason, this invention is not to be construed as being limited to only the illustrative embodiments, but is to be construed in view of the claims.

We claim:

1. A fully planar bipolar transistor comprising:
 a semiconductor substrate,
 a first layer formed on said substrate to form a first transistor region which comprises one of a collector or an emitter, said first layer having a first surface in contact with said substrate and a second surface spaced away from said first surface,
 an isolated base formed at said second surface of said first layer in a region extending over a limited area bounded by a perimeter to define an active base region of said transistor,
 a second layer formed on said first layer and on the base to form an interface thereto,
 said second layer having a first surface at said interface and a second surface spaced away from said first surface,
 each of said layers and said base being made of doped Group III-V materials;
 a base contact and extension means formed in said second layer to extend from said second surface thereof into electrical contact with said base to form an ohmic connection therebetween without a via,
 said base contact and extension means being further formed into a closed ring surrounding and defining a second, electrically isolated transistor region which comprises the other of said emitter or collector in said second layer,
 a first contact means formed on the second surface of said second layer outside said ring to form an ohmic connection to said first layer without a via, and
 a second contact means formed on said second surface of said second layer inside said ring to form an ohmic connection to said second transistor region without a via,
 so that said base contact and extension means, first contact means, and second contact means are located in a coplanar arrangement on the second surface of said second layer.

2. The transistor of claim 1 wherein:
 said second, electrically isolated transistor region comprises the emitter of said transistor; and
 said first transistor region includes the collector of said transistor.

3. The transistor of claim 1 wherein:
 said base contact and extension means is implanted into said second layer to extend through said second layer to said first surface thereof.

4. The transistor of claim 1 including:
 means forming a separation zone between said base contact and extension means and said second, electrically isolated transistor region, said separation zone for inhibiting parasitic diode formation between said second, electrically isolated transistor region and said base contact and extension means.

5. The transistor of claim 4 including:
 a dielectric material located in said separation zone.

6. The transistor of claim 1 wherein:
 said base is formed in said first layer by implantation into said first layer.

7. A transistor of claim 6 wherein:
 said base contact and extension means is implanted into said second layer so as to be contiguous with the perimeter of said implanted base.

8. The transistor of claim 7 wherein:
 said base and said base contact and extension means are annealed after implantation.

9. The transistor of claim 1 wherein:
 said first layer is formed of a gallium arsenide material; and
 at least a portion of said second layer is formed of a gallium aluminum arsenide material.

10. The transistor of claim 9 wherein:
 said second layer includes a gallium aluminum arsenide heterojunction layer adjacent to said first layer of gallium arsenide; and
 said second layer further includes a gallium arsenide contact layer located distal from said first layer, said second surface of said second layer comprising the surface of said gallium arsenide contact layer.

11. A fully planar bipolar transistor comprising:
 a semiconductor substrate, a first layer epitaxially grown on said substrate to form a collector, a base formed at said collector, a second layer epitaxially grown on said collector and said base, said second layer forming a first surface at the interface with said first layer and second surface spaced away from said first surface, each of said layers and said base being made of doped Group III-V materials;

a base contact implated into said second layer to extend from the second surface of the second layer to the base, said base contact being formed into a closed ring surrounding and defining an isolated emitter in said second layer, an emitter contact formed on said second surface of said second layer at said emitter, and a collector contact formed on said second surface of the said second layer outside said base contact for electrical connection to said collector.

12. A transistor of claim 11 wherein:

said base comprises p type material and said isolated emitter and said collector comprises n type material.

13. A transistor of claim 11 wherein:

one of said first and second layers is gallium arsenide, and the other of said first and second layers is gallium aluminum arsenide.

14. An integrated circuit comprising:

a semiconductor substrate, at least two transistors formed on said substrate in accordance with the structure of claim 1 circuit metallization runs without vias connecting said transistors to an external environment; and electrical connection means for connecting the respective first contact means, second contact means and base contact and extension means into circuits for forming functional integrated circuits.

15. An integrated circuit as in claim 14 further including means for isolating said base from said emitter and from said collector and the individual transistors in said second layer.

16. A device of claim 14 wherein:

said first layer is a gallium arsenide layer; and said second layer includes a gallium aluminum arsenide layer.

17. An integrated circuit device which comprises:

a substrate;

a first layer formed on said substrate;

a second layer formed on said first layer, said second layer having a first surface in contact with said first layer and a second surface distal from said first layer;

each of said layers being made of doped Group III-V materials;

a plurality of bipolar transistors formed n said first and second layers;

each of said transistors including:

a) an isolated base formed on a portion of said first layer and bounded by a perimeter and overlaid by said second layer, b) base contact and extension means for forming an electrical connection through said second layer between said base and the second surface of said second layer and further for forming an isolated region in said second layer c) a first layer contact means for forming an electrical contact to said first layer by utilizing said second layer as a conduction pathway to said first layer, said first layer contact means located in association with said second surface of said second layer and electrically isolated from said isolated region, d) base contact means for forming an electrical contact to said base by utilizing said base contact and extension means as a conduction pathway to said base, said base contact means located in association with said second surface of said second layer, e) an isolated region contact means for forming an electrical contact with said isolated region, said isolated region contact means located in association with said second surface of said second layer in contact with said isolated region;

isolation means for electrically isolating said plurality of transistors from each other;

means for forming circuit metallization runs for connecting said device to an external environment and for connecting the respective first layer contact means, base contact means and isolated region contact means into circuits for forming functional integrated circuits on said device.

18. A device of claim 17 wherein:

said isolated regions comprises bipolar transistor emitters; and said isolation means isolating individual device zones in said first layer which includes a bipolar transistor collector in each of said zones, each of said respective bipolar transistor collectors electrically associated with a respective one of said bipolar transistor bases and a respective one of said bipolar transistor emitters.

19. A device of claim 17 wherein:

said transistors comprise heterojunction bipolar transistors.

20. A device of claim 19 wherein:

said first layer is a gallium arsenide layer; and said second layer includes a gallium aluminum arsenide layer.

21. A group III - group V bipolar transistor which comprises:

a semi-insulating substrate;

a first collector layer epitaxially formed on said substrate;

an isolated base bounded by a perimeter ion implanted in said collector layer;

a second layer epitaxially formed on said collector layer over said ion implanted base region, said second layer having a free surface on the side away from the collector layer and base;

each of said layers and said base being made of doped Group III-V materials, a base contact region ion implanted in said second layer to extend between said free surface of said second layer and said base;

said base contact region surrounding and defining an emitter region in said second layer;

a base ohmic contact located on said free surface in a location so as to contact said base contact region;

an emitter ohmic contact located on said free surface and contacting said emitter region; and a collector ohmic contact located on said surface of said second layer in a position isolated form said emitter region by said base contact region and making an electrical contact with said collector layer by utilizing said second layer as a contact pathway.

22. A transistor of claim 21 wherein:

said first and second layers form a heterojunction with each other.

23. A transistor of claim 21 wherein:
said base ohmic contact, said emitter ohmic contact and said collector ohmic contact are formed of a refractory metal chosen from the group consisting of molybdenum, tungsten and tantalum.

24. A transistor of claim 23 further including:
a dielectric coating located over said base ohmic contact; and
said dielectric coating comprising a self aligning mask for said emitter ohmic contact.

25. A fully planar bipolar transistor comprising:
a semiconductor substrate,
a first layer formed of a gallium arsenide material formed on said substrate to form a first transistor region,
a base formed at said first layer,
a second layer formed on the first layer and on the base to form an interface thereto, said second layer having a first surface at the interface with the first layer, and a second surface spaced away from said first surface;
at least a portion of said second layer being formed of a gallium aluminum arsenide material,
a base contact and extension means formed into said second layer to extend from said second surface into electrical contact with said control region to form an ohmic connection therebetween without a via,
said base contact and extension means being formed into a closed ring surrounding and defining a second, electrically isolated transistor region in said second layer,
a first region contact means formed on the second surface of said second layer outside said ring to form an ohmic connection to said first layer without a via, and
a second region contact formed on said second layer, the second surface inside said ring to form an ohmic connection to said second region without a via.

26. The transistor as in claim 1 further in which
said Group III materials are selected from gallium (Ga), aluminum (Al), and indium (IN), and GaAl, and
said Group V materials are selected from arsenic (As), phosphorus (P) and antimony (Sb).

27. An integrated circuit comprising:
a semiconductor substrate,
at least two transistors formed on said substrate in accordance with the structure of claim 11 circuit metallization runs without vias connecting said device to an external environment; and
electrical connection means for connecting the respective first layer contact means, control layer contact means and isolated region contact means into circuits for forming functional integrated circuits on said device and to said pin out means for connecting said circuits to said circuit metallization runs.

28. An integrated circuit device which comprises:
a substrate;
a first layer formed on said substrate and made of gallium arsenide;
a second layer formed on said first layer, said second layer forming a heterojunction with said first layer, said second layer being made of gallium aluminum and arsenide;
a plurality of bipolar transistors formed in said first and second layers;
each of said transistors including:
a) an isolated base formed on a portion of said first layer bounded by a perimeter and overlaid by said second layer,
b) base contact and extension means for forming an electrical connection through said second layer between said base and the second surface of said second layer and further for forming an isolated region in said second layer
c) a first layer contact means for forming an electrical contact to said first layer by utilizing said second layer as a conduction pathway to said first layer, said first layer contact means located in association with said surface of said second layer and electrically isolated from said isolated region,
d) base contact means for forming an electrical contact to said base by utilizing said base contact and extension means as a conduction pathway to said base, said base contact means located in association with said second surface of said second layer,
e) an isolated region contact means for forming an electrical contact with said isolated region, said isolated region contact means located in association with said surface of said second layer in contact with said isolated region;
isolation means for electrically isolating said plurality of transistors from each other;
means for forming circuit metallization runs for connecting said device to an external environment and
for connecting the respective first layer contact means, base contact means and isolated region contact means into circuits for forming functional integrated circuits on said device.

* * * * *